(12) United States Patent
Lee et al.

(10) Patent No.: US 6,946,601 B1
(45) Date of Patent: Sep. 20, 2005

(54) ELECTRONIC PACKAGE WITH PASSIVE COMPONENTS

(75) Inventors: I-Tseng Lee, Taipei Hsien (TW); Jen-Te Tseng, Taipei Hsien (TW)

(73) Assignee: VIA Technologies Inc., Taipei Hsien (TW)

( * ) Notice: Subject to any disclaimer, the term of this patent is extended or adjusted under 35 U.S.C. 154(b) by 0 days.

(21) Appl. No.: 10/711,675

(22) Filed: Sep. 30, 2004

(30) Foreign Application Priority Data

May 28, 2004 (TW) ................. 93115225 A

(51) Int. Cl.⁷ .................. H01L 23/28; H05K 5/06
(52) U.S. Cl. .................. 174/52.2; 361/782
(58) Field of Search .............. 174/52.2, 52.4; 257/690, 781; 361/782

(56) References Cited

U.S. PATENT DOCUMENTS

| | | | |
|---|---|---|---|
| 6,512,183 B2 * | 1/2003 | Mitani et al. | 174/257 |
| 2003/0038366 A1 * | 2/2003 | Kozono | 257/723 |

* cited by examiner

*Primary Examiner*—Hung V. Ngo
(74) *Attorney, Agent, or Firm*—Jiang Chyun IP Office

(57) ABSTRACT

An electronic package with a passive component includes a circuit carrier, at least a passive component and an anisotropic conductive layer. The circuit carrier has at least a passive-component-pad set including multiple pads. The passive component has multiple electrodes placed over the corresponding pads of the passive-component-pad set. The anisotropic conductive layer is deposited between the electrodes and the pads.

25 Claims, 8 Drawing Sheets

ELECTRONIC PACKAGE WITH PASSIVE COMPONENTS

CROSS-REFERENCE TO RELATED APPLICATION

This application claims the priority benefit of Taiwan application serial no. 93115225, filed May 28, 2004.

BACKGROUND OF THE INVENTION

1. Field of the Invention

The present invention generally relates to an electronic package. More particularly, the present invention relates to an electronic package with a passive component.

2. Description of the Related Art

Passing with the development of electronic technology, electronic products with multiple function are continuously released and have a trend with lightness, thinness, shortness and smallness. A circuit carrier, such as printed circuit board (PCB) or chip carrier, is commonly used in an electronic package. The circuit carrier is mainly composed of multiple patterning circuit layers and multiple dielectric layers that are provided with a stack by turns. The dielectric layer is deposited between the neighboring patterning circuit layers. Multiple plated through holes or vias formed through the dielectric layers connect the patterning circuit layers. The circuit carrier is widely used in various electronic packages, such as ball grid array (BGA) package or pin grid array (PGA) package. Passive components, such as capacitor, can be mounted on the circuit carrier to improve the quality of signal transition. The cross talk created with signal switches can be alleviated, for example.

FIG. 1 is a cross-sectional view depicting a conventional electronic package with a passive component. Referring to FIG. 1, the conventional electronic package 100 includes a circuit carrier 110, a chip 120 and a passive component 130. The circuit carrier 110 has a first surface 110a on which the chip 120 is mounted using an adhesive layer 150. Multiple wires 160 are formed to connect the chip 120 to the circuit carrier 110 using a wire bonding process. One or more passive components, such as capacitor, inductor or resistor, are electrically connected on the first surface 110a of the circuit carrier 110 by means of solder 140. A molding compound 170 encapsulates the passive component 130 and the chip 120. The circuit carrier 110 has a second surface 110b on which multiple solder balls 180 are mounted on the second surface 110b of the circuit carrier 110.

Referring to the magnified view at right side of FIG. 1, a patterning circuit layer 112 and a solder mask layer 114 are formed on a surface layer of the circuit carrier 110. The patterning circuit layer 112 has a passive-component-pad set 112a including a first pad 112b and a second pad 112c. The solder mask layer 114 is formed on the patterning circuit layer 112 and has opening exposing the first pad 112b and the second pad 112c of the passive-component-pad set 112a.

The passive component 130 has a first electrode 130b and a second electrode 130c that are electrically and physically connected to the first pad 112b and the second pad 112c respectively by solder 140. In the process of bonding the passive component 130 onto the circuit carrier 110 using a reflow method, the solder 140 has flux for enhancing the bonding between the first electrode 130b and the first pad 112b and between second electrode 130c and the second pad 112c. After the passive component 130 is bonded onto the circuit carrier 110, the flux remaining on the circuit carrier 110 should be removed in a clean process.

Referring to the magnified view at right side of FIG. 1, the flux flowing into the gap between the passive component 130 and the solder mask layer 114 may not be easily removed because the gap is very small. Moreover, in the encapsulating process, the molding compound 170 doesn't easily flow into the gap between the passive component 130 and the solder mask layer 114. When the electronic package 100 experiences a high-temperature process once more, such as reflow process, the solder 140 formed on the first pad 112b and the second pad 112c may be melted again and then may flow into the gap between the passive component 130 and the solder mask layer 114 so that a short circuit may be created between the first pad 112b and the second pad 112c through the solder 140, leading the passive component 130 to be inactive. Namely, this is called the solder bridge issue. More particularly, the circuit carrier 110 and the passive component 130 develop following the trend of fine pitch with a shorter and shorter distance between the first pad 112b and the second pad 112c of the circuit carrier 110. The flux flowing into the gap between the passive component 130 and the solder mask layer 114 may be more difficultly removed, leading the solder bridge issue to occur when the passive component 130 is bonded onto the circuit carrier 110 using a soldering process.

The passive component 130 may be mounted under the wires 160 for reducing the area of the electronic package. When the wires 160 sag, they may contact with one of the electrode of the passive component 130, creating a short circuit. Therefore, the wires 160 should be formed with a large height. However, this may cause the wires 160 to be shifted during encapsulating the molding compound 170, so the neighboring wires 160 may be led to become a short circuit.

In the prior art, the solder 140 is formed on the first pad 112b and the second pad 112c of the circuit carrier 110 using a printing process. In the printing process, solder paste is first deposited on a stencil placed on the circuit carrier 110. Then, the solder paste is filled into multiple openings in the stencil with scraping the solder paste on the stencil to form the solder paste on the first pad 112b and the second pad 112c of the circuit carrier 110. The solder 140 is formed out of the solder paste using a reflow process. However, after exposed to the air, the solder paste is gradually worse and worse. The solder paste should be thrown away if it still remains in a term after the bottle filled with the solder paste is uncovered. Moreover, only few passive components 130 should be mounted on the circuit carrier 110 using a soldering process, so much solder paste may be left and should be abandoned. As a result, the cost of mounting the passive component 130 is raised.

In order to solve the above problem, chemical-plating processes have been proposed for plating the metal layers. However, the metal layer plated using such chemical plating processes is very thin and has unstable electrical properties.

SUMMARY OF THE INVENTION

Accordingly, in an embodiment of the present invention, an electronic package with a passive component is provided to solve the solder bridge issue and to enhance the reliability of an electronic package.

To achieve these and other advantages and in accordance with the purpose of the invention, as embodied and broadly described herein, the present invention provides an electronic package with a passive component that includes a circuit carrier, at least a passive component and an anisotropic conductive layer, for example. The circuit carrier has at least a passive-component-pad set including multiple pads. The passive component has multiple electrodes placed over the corresponding pads of the passive-component-pad set. The anisotropic conductive layer is deposited between the electrodes and the pads.

The electronic package with a passive component according to the present invention uses the anisotropic conductive layer to electrically connect the passive component to the circuit carrier. Therefore, the solder bridge issue due to the flux remaining on the circuit carrier in the prior art can be avoided and the reliability of the electronic package can be improved. Moreover, the appearance of the electronic package is exquisite with the anisotropic conductive layer to electrically connect the passive component to the circuit carrier. The cleaning process for removing the flux practiced in the prior art is saved in the present invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
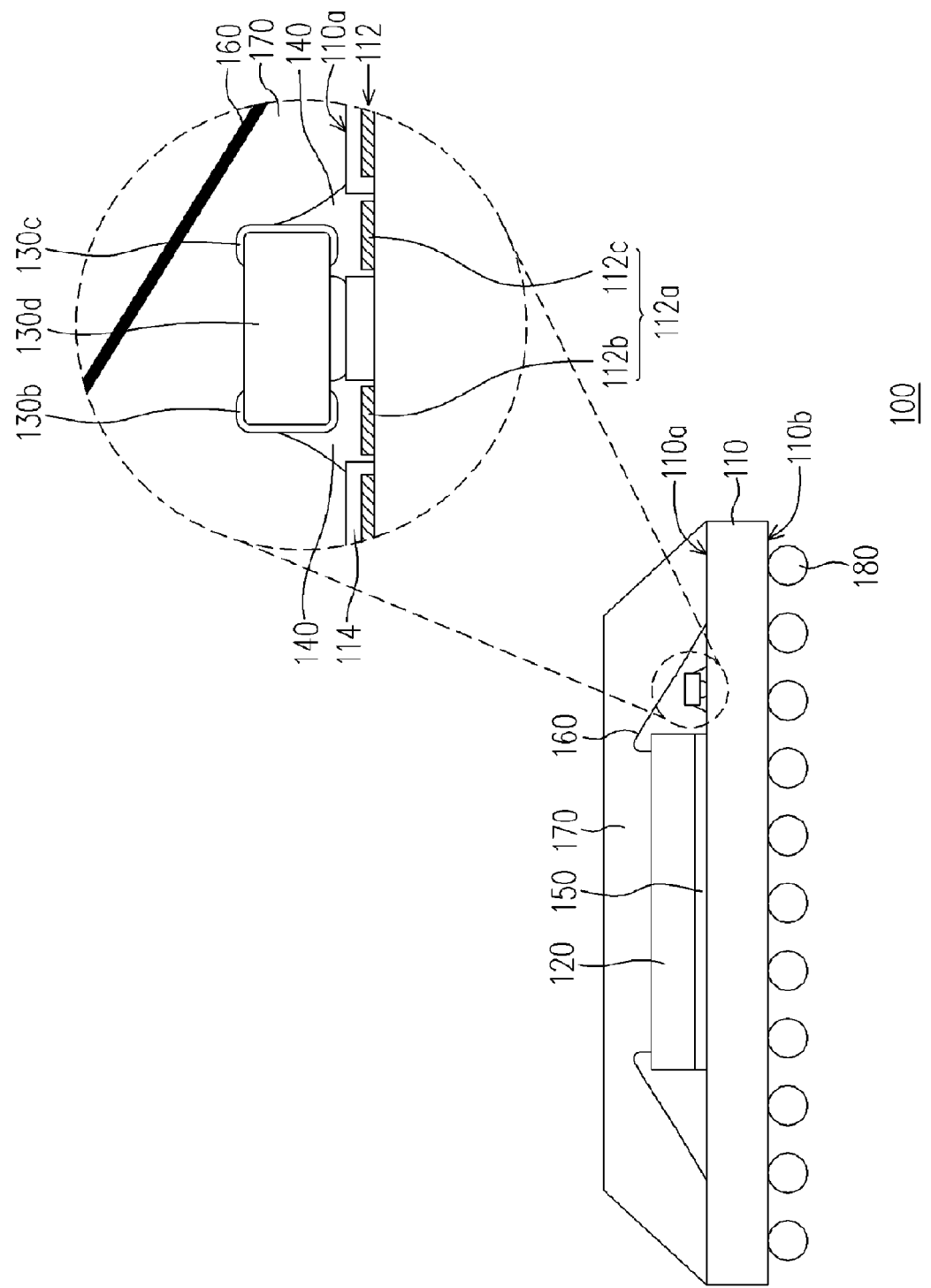
FIG. 1 is a cross-sectional view depicting a conventional electronic package with a passive component.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2A:
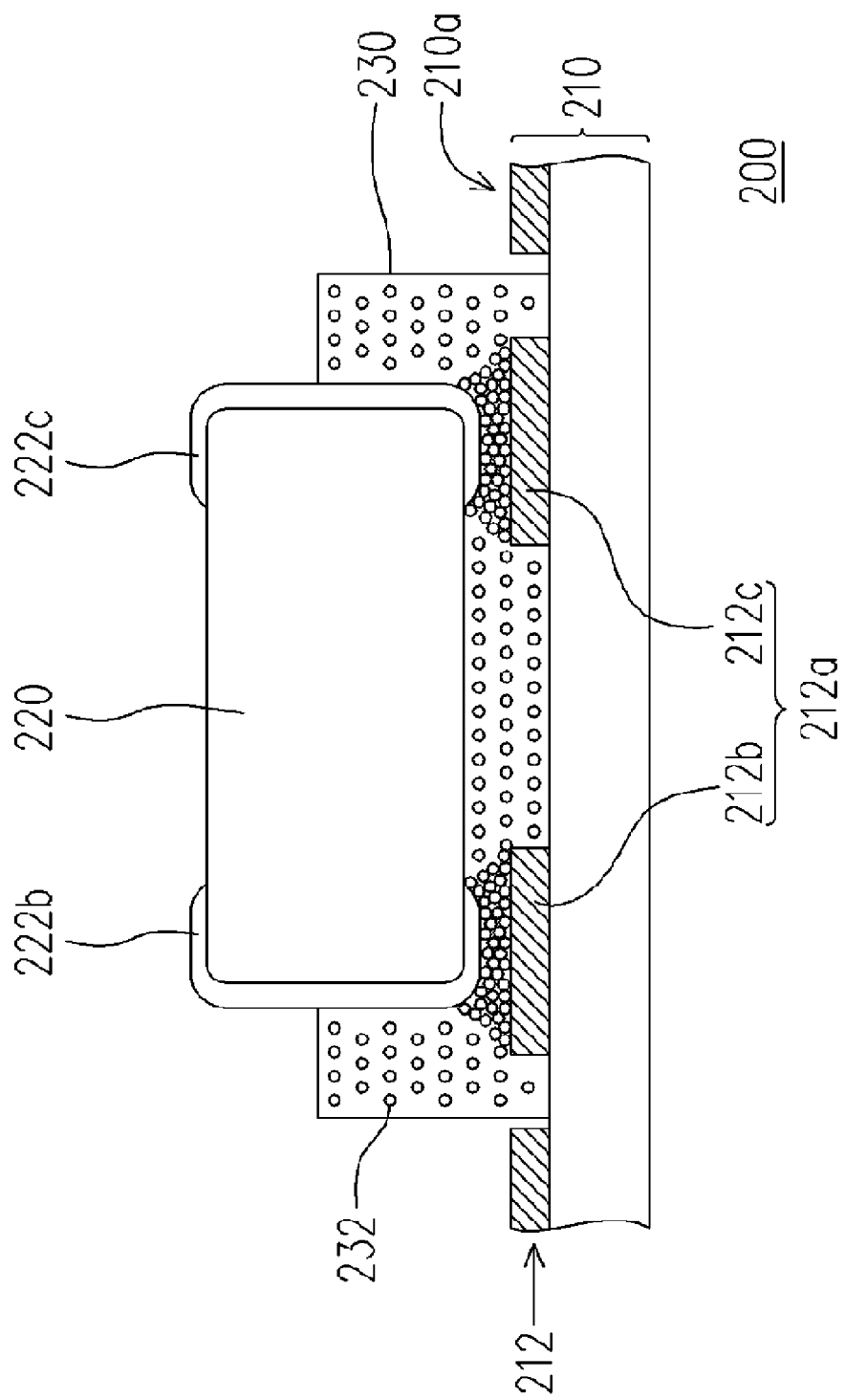
FIGS. 2A and 2B are cross-sectional views depicting an electronic package with a passive component according to a first embodiment of the present invention.
Figure 2B:
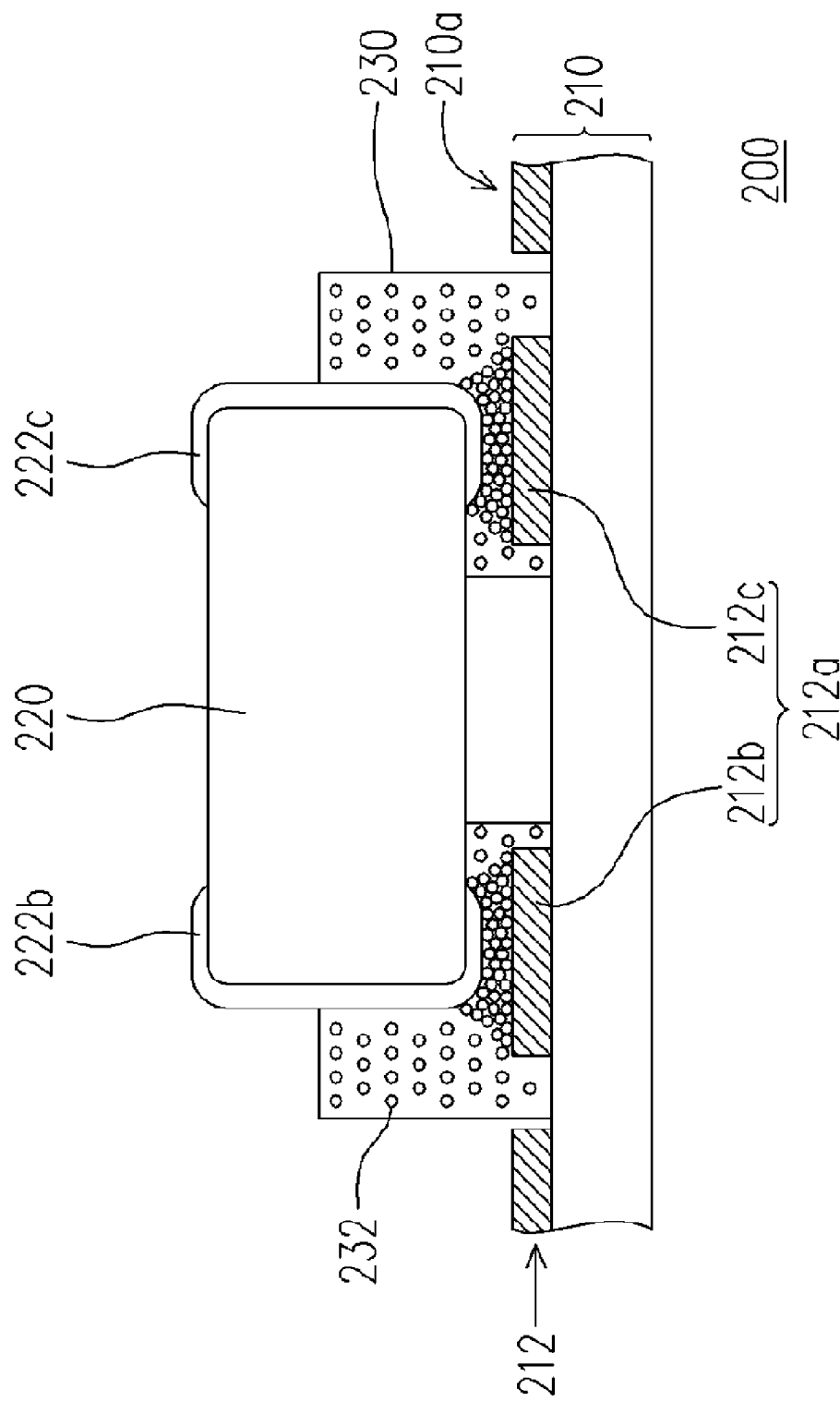

FIGS. 2A and 2B are cross-sectional views depicting an electronic package with a passive component according to a first embodiment of the present invention. Referring to FIG. 2A, the electronic package 200 includes a circuit carrier 210, at least a passive component 220 and an anisotropic conductive layer 230, wherein the passive component 220 is electrically connected to the circuit carrier 210 through the anisotropic conductive layer 230. The circuit carrier 210 includes a patterning circuit layer 212 formed on a first surface 210a thereof. The patterning circuit layer 212 has at least a passive-component-pad set 212a including a first pad 212b and a second pad 212c. The passive component 220 has a first electrode 222b and a second electrode 222c that are positioned over the first pad 212b and the second pad 212c. The anisotropic conductive layer 230 is deposited between the first electrode 222b and the first pad 212b and between the second electrode 222c and the second pad 212c to electrically and physically connect the passive component 220 to the circuit carrier 210.

The passive component 220 can be a capacitor, an inductor or a resistor, for example. The anisotropic conductive layer 230 can be made of an anisotropic conductive film (ACF) or an anisotropic conductive paste (ACP), for example. The circuit carrier 210 can be a printed circuit board (PCB), a chip carrier or a flexible PCB, for example.

Referring to 2A, the method for fabricating the electronic package 200 with a passive component includes the following process. An anisotropic conductive layer 230 is formed on the first pad 212b and the second pad 212c by attaching an anisotropic conductive film (ACF) or by coating an anisotropic conductive paste (ACP). The passive component 220 is pressed into the anisotropic conductive layer 230 such that some conductive particles 232 distributed in the anisotropic conductive layer 230 can be accumulated between the first electrode 222b and the first pad 212b, and some conductive particles 232 distributed in the anisotropic conductive layer 230 can be accumulated between the second electrode 222c and the second pad 212c. The passive component 220 is electrically connected to the circuit carrier 210 through the conductive particles 232. After the passive component 220 is mounted onto the anisotropic conductive layer 230, the anisotropic conductive layer 230 is cured by a curing process. Thereafter, the molding compound 240 is formed to encapsulate the passive component 220 and the anisotropic conductive layer 230. It should be noted that the anisotropic conductive film or plate does not become worse due to the exposure to the air.

The anisotropic conductive layer 230 replaces the solder 140 used in the prior art to electrically connect the passive component 220 to the circuit carrier 210. Therefore, the solder bridge issue occurring in the prior art can be avoided. The cleaning process for removing the flux practiced in the prior art is saved in the present invention. Besides, in the prior art, the reflow process using infrared rays takes about five minutes, but, in the present invention, the curing process just takes less time, approximately 10 to 20 seconds. Moreover, the contamination due to the remaining solder occurring in the prior art can be avoided.

As shown in FIG. 2A, the anisotropic conductive layer 230 covers the region between the first pad 212b and the second pad 212c of the circuit carrier 210. In the prior art, the solder 140 is deposited only on the first pad 112b and the second pad 112c, as shown in FIG. 1. A predetermined pitch must be kept between the first pad 112b and the second pad 112c to prevent the first pad 112b and the second pad 112c from be electrically connected through the solder 140 when the solder bridge issue happens. Therefore, the objective for fine pitches can not be attained in the prior art. However, in the present invention, the anisotropic conductive layer 230 only deposited between the first electrode 222b and the first pad 212b and between the second electrode 222c and the second pad 212c has a conductive function. The anisotropic conductive layer 230 formed on the region between the first pad 212b and the second pad 212c of the circuit carrier 210 does not have a conductive function. The anisotropic conductive layer 230 has conductivity in a predetermined direction. As a result, a short circuit can not be created between the first pad 212b and the second pad 212c. The pitch between the first pad 212b and the second pad 212c can be smaller by means of the anisotropic conductive layer 230 replacing the solder.

Referring to FIG. 2B, the structure shown in FIG. 2B resembles that shown in FIG. 2A. The difference between FIG. 2A and FIG. 2B is that the anisotropic conductive layer 230 shown in FIG. 2B is formed only over the first pad 212b and the second pad 212c. The anisotropic conductive layer 230 formed over the first pad 212b is disconnected from that formed over the second pad 212c. The region where the anisotropic conductive layer 230 is formed is relatively small, so the use of the anisotropic conductive layer 230 can be reduced.

Second Embodiment

Figure 3A:
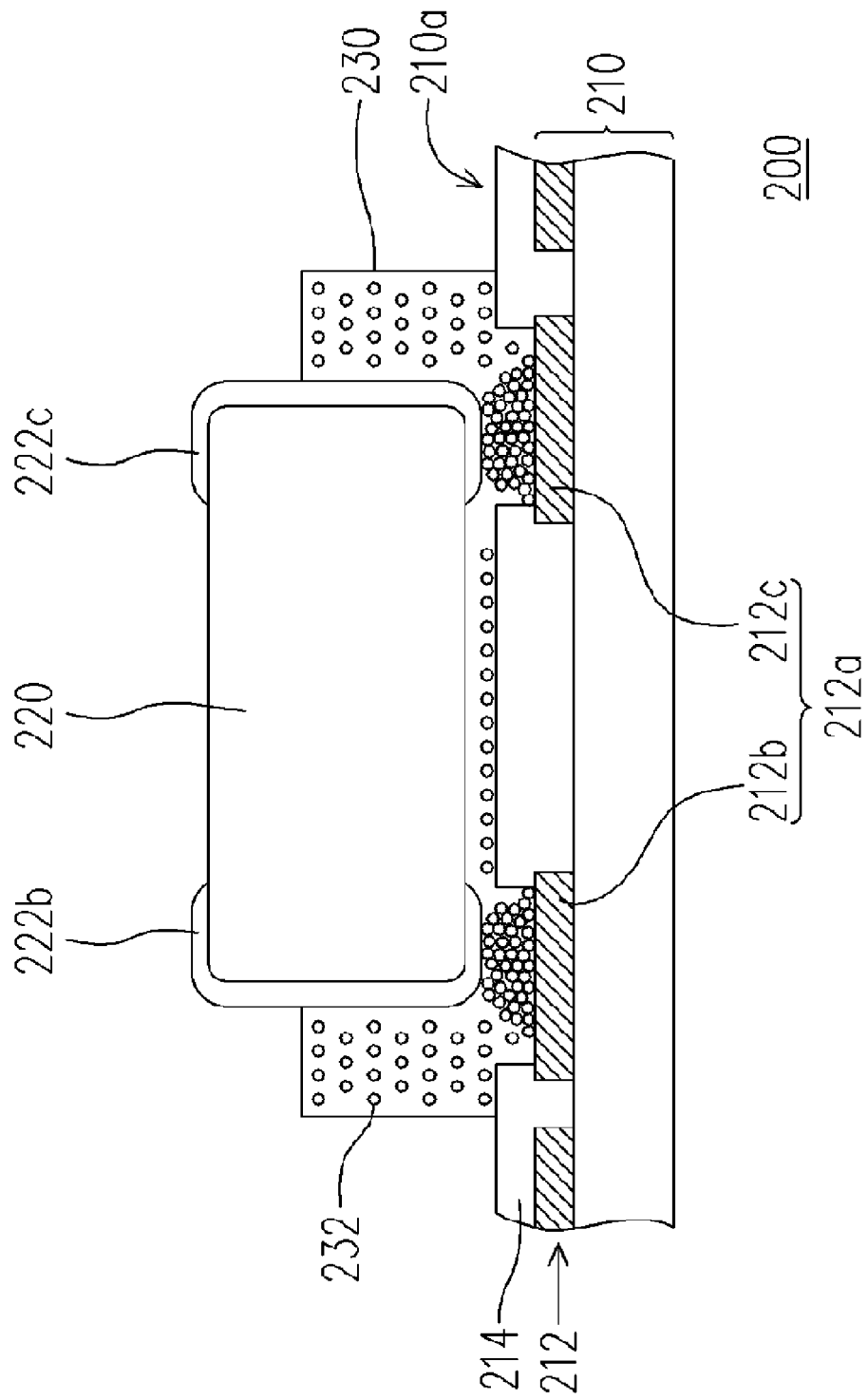
FIGS. 3A through 3C are cross-sectional views depicting an electronic package with a passive component according to a second embodiment of the present invention.
Figure 3B:
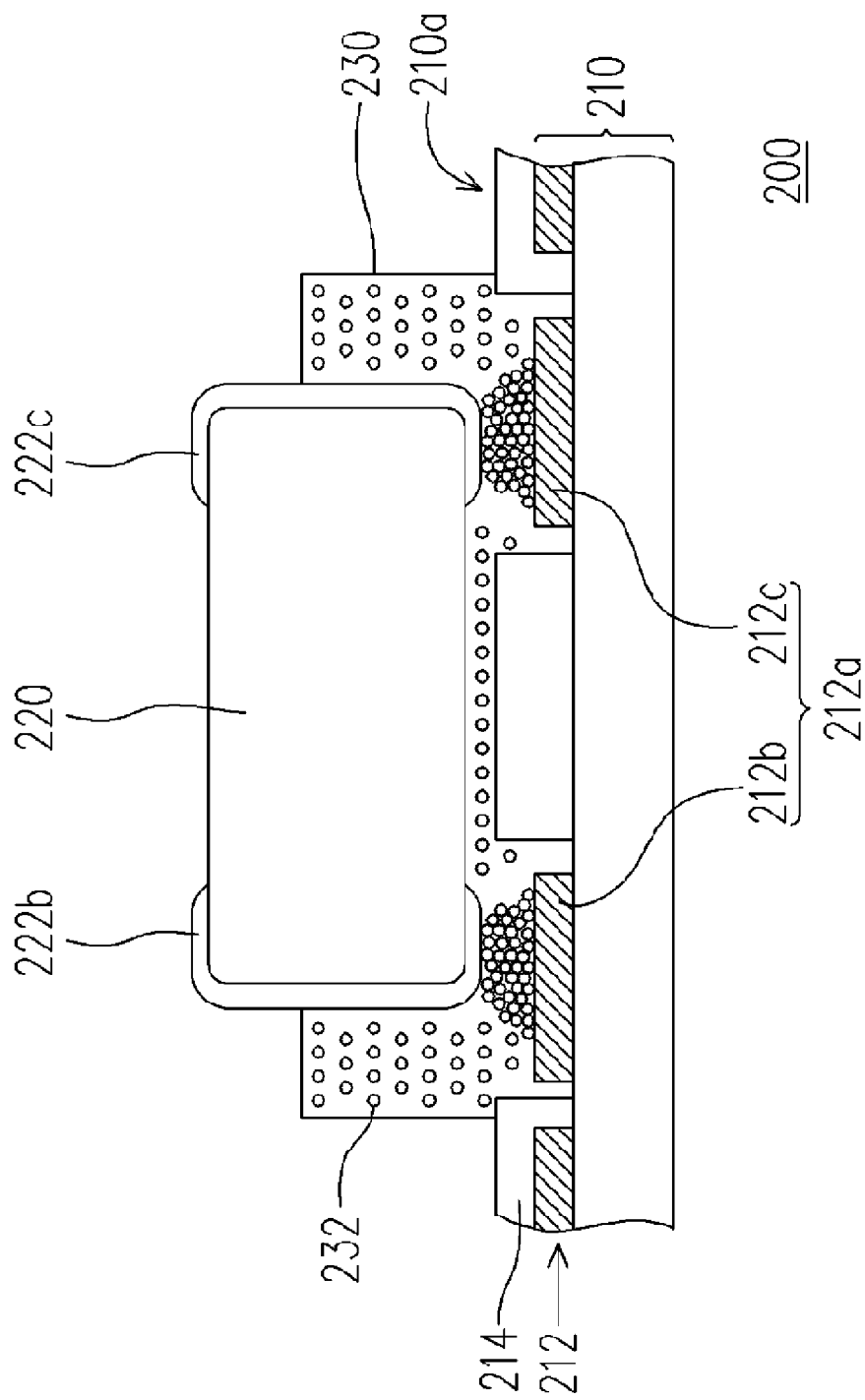
Figure 3C:
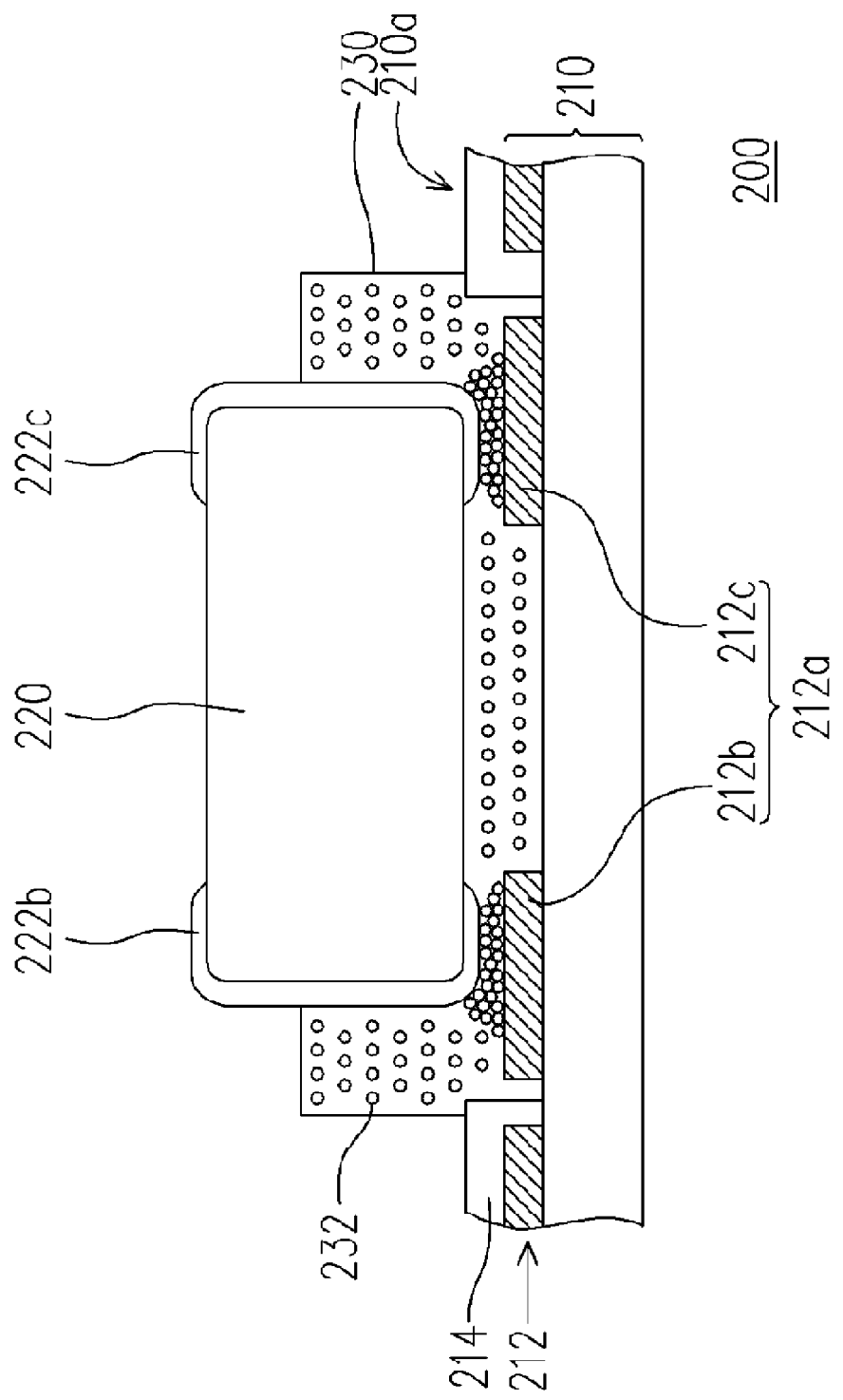

FIGS. 3A through 3C are cross-sectional views depicting an electronic package with a passive component according to a second embodiment of the present invention. The same reference numerals used throughout the first embodiment and the second embodiment indicate the same or similar elements.

Referring to FIG. 3A, the second embodiment is similar to the first embodiment. The difference between the second embodiment and the first embodiment is that the circuit carrier 210 further includes a solder-mask layer 214 formed over the patterning circuit layer 212. The exposed area of the first pad 212b and the second pad 212c is defined by the solder-mask layer 214. The relationship between the pads and the solder-mask layer 214 is termed as solder-mask-defined type (SMD). The anisotropic conductive layer 230 covers the first pad 212b and the second pad 212c and further covers the region between the first pad 212b and the second pad 212c, as shown in FIG. 3A. Alternatively, the anisotropic conductive layer 230 may be firmed only over the first pad 212b and the second pad 212c, which is combined with the structure shown in FIG. 2B.

The way to define the exposed area of the first pad 212b and the second pad 212c according to the present invention is not limited to the SMD type. Referring to 3B, the solder-mask layer 214 has an opening exposing all of the upper surface of the first pad 212b and the second pad 212c. The relationship between the pads and the solder-mask layer 214 is termed as non-solder-mask-defined type (NSMD). The anisotropic conductive layer 230 covers the first pad 212b and the second pad 212c and further covers the region between the first pad 212b and the second pad 212c, as shown in FIG. 3B. Alternatively, the anisotropic conductive layer 230 may be firmed only over the first pad 212b and the second pad 212c, which is combined with the structure shown in FIG. 2B.

The solder-mask layer 214 has openings not limited to only exposing the first pad 212b and the second pad 212c according to the present invention. Referring to FIG. 3C, the solder-mask layer 214 may not cover the region between the first pad 212b and the second pad 212c. The anisotropic conductive layer 230 covers the first pad 212b and the second pad 212c and further covers the region between the first pad 212b and the second pad 212c, as shown in FIG. 3C. The passive component 220 is mounted between the first pad 212b and the second pad 212c where the solder-mask layer 214 is not formed, so the passive component 220 has a lower height projected from the circuit carrier 210. Alternatively, the anisotropic conductive layer 230 may be firmed only over the first pad 212b and the second pad 212c, which is combined with the structure shown in FIG. 2B.

The method for mounting a passive component onto a circuit carrier according to the present invention can be applied to all kinds of electronic package, such as wire-bonding package or flip-chip package. The wire-bonding package and the flip-chip package applying the present invention are recited in the following.

Figure 4:
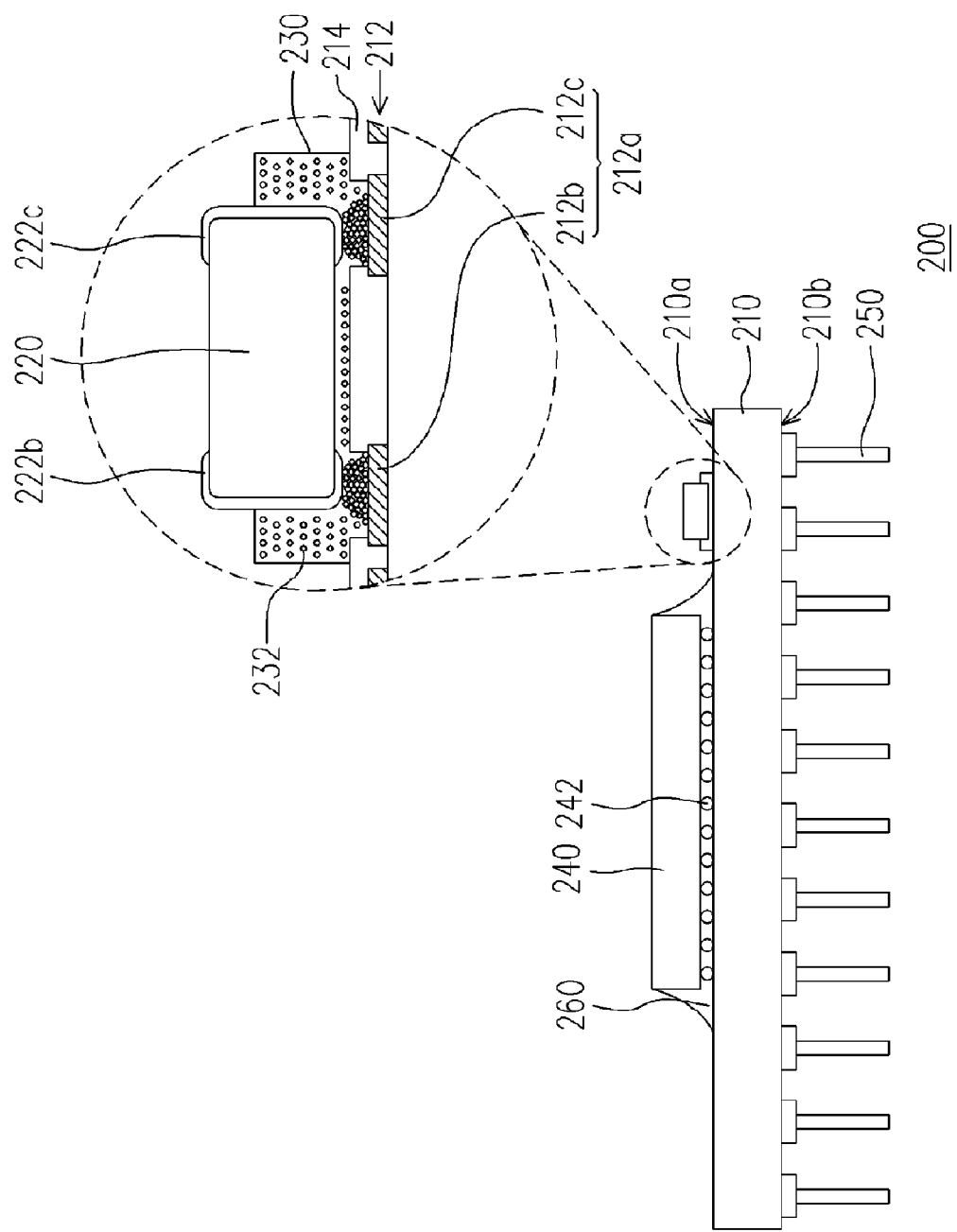
FIG. 4 is a cross-sectional view depicting a passive component mounted in the electronic package with a flip chip.

FIG. 4 is a cross-sectional view depicting a passive component mounted in the electronic package with a flip chip. Referring to FIG. 4, the electronic package 200 further includes at least a chip 240 and an underfill 260. The chip 240 is electrically and physically connected to the circuit carrier 210 through bumps 242 using a flip-chip bonding technology. The underfill 260 is filled between the chip 240 and the circuit carrier 210. The electronic package 200 further includes multiple electrical points 250 formed on a second surface 210b of the circuit carrier 210. The electrical points 250 may be pins as shown in FIG. 4 or solder balls as shown in FIG. 5.

Referring to FIG. 4, the present invention is not limited to a single passive component 220 mounted on the first surface 210a of the circuit carrier 210. Alternatively, multiple passive components 220 may be mounted on the first surface 210a of the circuit carrier 210, wherein each passive component 220 is electrically and physically connected to the corresponding one of the passive-component-pad sets 212a. Besides, the passive component 220 is not confined to being mounted on the first surface 210a of the circuit carrier 210. Alternatively, the passive component 220 may be mounted on the second surface 210b of the circuit carrier 210. Moreover, the electrical points 250 are not confined to being mounted on the second surface 210b of the circuit carrier 210. Alternatively, the electrical points 250 may be mounted on the first surface 210a of the circuit carrier 210. Besides, The structures shown in FIGS. 2A, 2B, 3B and 3C can be optionally applied in the electronic package 200 shown in FIG. 4.

Figure 5:
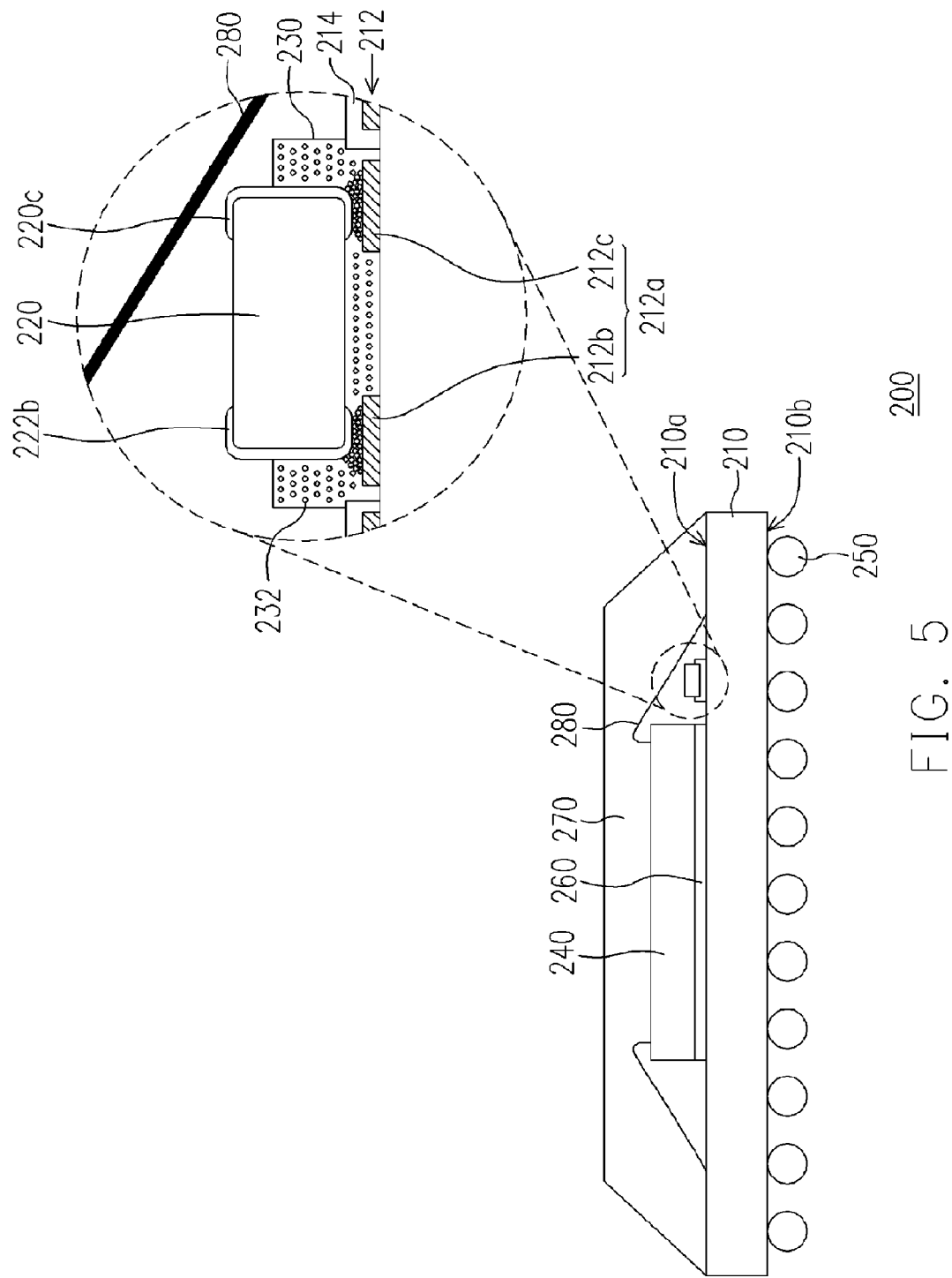
FIG. 5 is a cross-sectional view depicting a passive component mounted in the electronic package with multiple wires.

FIG. 5 is a cross-sectional view depicting a passive component mounted in the electronic package with multiple wires. Referring to FIG. 5, the chip 240 is electrically connected to the circuit carrier 210 through multiple wires 280 using a wire-bonding technology. An adhesive layer 260 is formed to attach the chip 240 onto the circuit carrier 210. The molding compound 270 encapsulates the chip 240, the passive component 220 and wires 280. Multiple electrical points 250 are formed on a second surface 210b of the circuit carrier 210. The electrical points 250 may be pins as shown in FIG. 4 or solder balls as shown in FIG. 5. The passive component 220 is not confined to being mounted on the circuit carrier 210 under the wires 280. Alternatively, the passive component 220 may be mounted on the circuit carrier 210 outside the wires 280. In the present invention, the passive component 220 is mounted on the circuit carrier 210 by the anisotropic conductive layer 230 replacing the solder used in the prior art, so the issues concerning solder can be avoided in the present invention.

In case that there is no solder-mask layer formed between the passive component 220 and the circuit carrier 210, the passive component 220 has a lower height projected from the circuit carrier 210. The height of the wires 280 can be lowered to improve the wire-shift issue. Moreover, the short circuit created by the sagging wires 280 contacting the passive component 220 can be avoided. According to the present invention, it is not limited that the molding compound 270 encapsulates the chip 240 and the passive component 220. Optionally, the molding compound 270 encapsulates the chip 240 but does not encapsulate the passive component 220. The electronic package shown in FIG. 5 is not limited to a single passive component 220 mounted on the first surface 210a of the circuit carrier 210. Alternatively, multiple passive components 220 may be mounted on the first surface 210a of the circuit carrier 210. Besides, the passive component 220 is not confined to being mounted on the first surface 210a of the circuit carrier 210. Alternatively, the passive component 220 may be mounted on the second surface 210b of the circuit carrier 210. Moreover, the electrical points 250 are not confined to being mounted on the second surface 210b of the circuit carrier 210. Alternatively, the electrical points 250 may be mounted on the first surface 210a of the circuit carrier 210. Besides, The structures shown in FIGS. 2A, 2B, 3A and 3B can be optionally applied in the electronic package 200 shown in FIG. 5.

According to the present invention, the passive-component-pad set 212a is not confined to having two pads, namely the first pad 212b and the second pad 212c. Optionally, the passive-component-pad set 212a may include more than two pads. The passive component 220 is not limited to having two electrodes, namely the first electrode 222b and the second electrode 222c. Optionally, the passive component 220 may include more than two pads. The passive component 220 is electrically and physically connected to the passive-component-pad set 212a. The anisotropic conductive layer 230 is arranged between these pads 212b and 212c and these electrodes 222b and 222c and electrically connects the electrodes 222b and 222c of the passive component 230 to the corresponding pads 212b and 212c of the passive-component-pad set 212a.

In the present invention, it is not limited that the anisotropic conductive layer 230 is made of anisotropic conductive film (ACF) or anisotropic conductive paste (ACP). The anisotropic conductive layer 230 can be any one of the materials creating conductivity only in part regions, optionally performing a pressing process and a heating process, such that the anisotropic conductive layer 230 electrically connects the electrodes of the passive component to the pads of the passive-component-pad set 212a.

CONCLUSION

In conclusion, major advantages of this invention at least includes:

1. The electronic package with a passive component according to the present invention replaces the solder used in the prior art with the anisotropic conductive layer to electrically connect the passive component to the circuit carrier. Therefore, the solder bridge issue due to the flux remaining on the circuit carrier can be avoided.

2. The cleaning process for removing the flux practiced in the prior art is saved in the present invention.

3. The curing process for curing anisotropic conductive film (ACF) or anisotropic conductive paste (ACP) takes less time, approximately 10 seconds through 20 seconds.

4. The pitch between two pads for connecting the passive component can be shorter by means of the anisotropic conductive layer because the solder bridge issue occuring in the prior art can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic package with a passive component comprising:
    a circuit carrier having a patterning circuit layer and a solder-mask layer formed over said patterning circuit layer, said patterning circuit layer having at least a passive-component-pad set, said passive-component-pad set having a first pad and a second pad;
    at least a passive component having a first electrode and a second electrode positioned over said first pad and said second pad, respectively; and
    an anisotropic conductive layer arranged between said first electrode and said first paid and between said second electrode and said second pad, wherein said solder-mask layer having at least one opening formed on said passive-component-pad set.

2. The electronic package of claim 1, wherein said anisotropic conductive layer covers said circuit carrier between said first pad and said second pad.

3. The electronic package of claim 1, wherein said anisotropic conductive layer covers said first pad and said second pad.

4. The electronic package of claim 1, wherein said solder-mask layer having at least one opening exposing all of the upper surface of said first pad and all of the upper surface of said second pad.

5. The electronic package of claim 4, wherein there is no solder-mask layer formed between said first pad and said second pad.

6. The electronic package of claim 1, wherein said solder-mask layer having at least one opening exposing part of the upper surface of said first pad and part of the upper surface of said second pad.

7. The electronic package of claim 1, further comprising a molding compound encapsulating said passive component.

8. The electronic package of claim 1, wherein said passive component comprises a resistor, an inductor or a capacitor.

9. The electronic package of claim 1, wherein said anisotropic conductive layer is made of anisotropic conductive film (ACF) or anisotropic conductive paste (ACP).

10. The electronic package of claim 1, further comprising at least a chip electrically connected to said circuit carrier.

11. The electronic package of claim 10, wherein said chip is electrically connected to said circuit carrier using a wire-bonding technology or using a flip-chip bonding technology.

12. The electronic package of claim 1, further comprising multiple electrical contacts arranged on said circuit carrier.

13. The electronic package of claim 12, wherein said electrical contacts comprise pins or solder balls.

14. An electronic package with a passive component comprising:

a circuit carrier having at least a passive-component-pad set and a solder-mask layer, said passive-component-pad set having multiple pads;

at least a passive component having multiple electrodes positioned over said pads of said circuit carrier, respectively; and an anisotropic conductive layer arranged between said electrodes and said pads, wherein said solder-mask layer having at least one opening formed on said passive-component-pad set.

15. The electronic package of claim 14, wherein said anisotropic conductive layer covers said circuit carrier between said pads.

16. The electronic package of claim 14, wherein said anisotropic conductive layer covers said pads.

17. The electronic package of claim 14, wherein said opening exposing all of the upper surface of said pads.

18. The electronic package of claim 17, wherein there is no solder-mask layer formed among said pads.

19. The electronic package of claim 14, wherein said circuit carrier has a plurality of openings exposing part of the upper surface of said pads, respectively.

20. The electronic package of claim 14, further comprising a molding compound encapsulating said passive component.

21. The electronic package of claim 14, wherein said passive component comprises a resistor, an inductor or a capacitor.

22. The electronic package of claim 14, wherein said anisotropic conductive layer is made of anisotropic conductive film (ACF) or anisotropic conductive paste (ACP).

23. The electronic package of claim 14, further comprising at least a chip electrically connected to said circuit carrier.

24. The electronic package of claim 23, wherein said chip is electrically connected to said circuit carrier using a wire-bonding technology or using a flip-chip bonding technology.

25. The electronic package of claim 14, further comprising multiple electrical contacts arranged on said circuit carrier.

* * * * *